United States Patent [19]

Erie et al.

[11] Patent Number: 4,713,682
[45] Date of Patent: Dec. 15, 1987

[54] DIELECTRIC BARRIER MATERIAL

[75] Inventors: David G. Erie, Cottage Grove; Jon A. Roberts, Minnetonka; Eddie C. Lee, Bloomington, all of Minn.

[73] Assignee: Honeywell Inc., Minneapolis, Minn.

[21] Appl. No.: 815,426

[22] Filed: Dec. 31, 1985

Related U.S. Application Data

[62] Division of Ser. No. 603,861, Apr. 25, 1984, abandoned.

[51] Int. Cl.$^4$ ............................................. H01L 29/34
[52] U.S. Cl. .......................................... 357/54; 357/71
[58] Field of Search ....................... 357/54, 55, 67, 68, 357/71

[56] References Cited

U.S. PATENT DOCUMENTS

| | | | |
|---|---|---|---|
| 3,868,723 | 2/1975 | Lechaton et al. | 357/54 |
| 4,172,004 | 10/1979 | Alcorn et al. | 156/643 |
| 4,203,800 | 5/1980 | Kitcher et al. | 156/643 |
| 4,242,698 | 12/1980 | Ghate et al. | 357/71 |
| 4,289,834 | 9/1981 | Alcorn et al. | 428/601 |
| 4,298,574 | 9/1981 | Radigan et al. | 156/643 |
| 4,322,264 | 3/1982 | Rioult et al. | 156/655 |
| 4,367,119 | 1/1983 | Logan et al. | 156/643 |
| 4,561,009 | 12/1985 | Yonezawa et al. | 357/71 |

FOREIGN PATENT DOCUMENTS 2047466 11/1980 United Kingdom .................. 357/55

OTHER PUBLICATIONS

Ryden et al., "A Metallization Providing Two Levels of Interconnect . . ." *IEEE Journal of Solid-State Aravits*, vol. SC-12, No. 4, Aug. 1977.
Aagard, R. L., "Three-Layer Optical Waveguide for Photolithographic Fabrication of Thin-Film Lenses" J. Vac. Sci. Technol., vol. 14, No. 1, Jan./Feb. 1977, pp. 275-277.
Hitchner, J. E. et al., "Chromium as an RIE Etch Barrier", IBM Tech. Discl. Bulletin, vol. 22, No. 10, Mar. 1980, pp. 4516-4517.
Humphrey, B. L., "Use of Oxidized Silcon Nitride as an Etch Stop for Plasma Etching", IBM Tech. Discl. Bulletin, vol. 23, No. 4, Sep. 1980, p. 1360.
Kitcher, J. R., "Integral Stud for Multilevel Metal", IBM Tech. Discl. Bulletin, vol. 23, No. 4, Sep. 1980, p. 1395.
Logan, J. S., "Dual Insulator with Etch-Stop for Memory Metalization; Large-Small Via Etch Sequence", vol. 23, No. 7B, Dec. 1980, pp. 3213-3215.

*Primary Examiner*—Martin H. Edlow
*Assistant Examiner*—Mark Prenty
*Attorney, Agent, or Firm*—William Udseth

[57] ABSTRACT

An integrated circuit comprising a substrate. The substrate comprises a semiconductor material and has a first surface. The circuit further comprises a layer of metalization interconnects over the first surface, each interconnect having a width. A first thin film layer comprising a dielectric barrier material is deposited directly onto the first layer of metalization interconnects. A second thin film layer comprising a dielectric passivating material is deposited directly onto the first thin layer of dielectric barrier material. A via is formed in the two thin film layers over a first metalization interconnect protruding into the via. The first metalization interconnect has a width less than the width of the via. A second metallization interconnect is connected to the first metalization interconnect in the via.

16 Claims, 7 Drawing Figures

DIELECTRIC BARRIER MATERIAL

BACKGROUND OF THE INVENTION

The Government has rights in this invention pursuant to Contract No. F33615-81-C-1527 awarded by the Department of the Air Force.

This application is a division of application Ser. No. 603,861, filed Apr. 24, 1984 and now abandoned.

The present invention relates to the processing of integrated circuits and, more particularly, to the use of a dielectric barrier material under a dielectric passivating material in order to effectively process oversized vias in multilayer metalization structures.

Previous methods of making via interconnections in integrated circuits required placing a via opening totally within a pad of an underlying metal. This metal acted as a stop for the etching of the passivating dielectric. The pad had to be large enough to facilitate easy alignment of the dielectric lithographic pattern to the metal pattern and to allow for overetching of the dielectric material.

Integrated circuits formed in accordance with the present invention do not require a pad of underlying metal but allow for the via to be oversized. That is, the via opening can overlap the metalization.

Integrated circuits are designed according to applicable minimum and maximum layout rules. In metalization layers, the spacing of metal features is determined by the smallest gap that can be patterned into the metal. In prior art via approaches, the pad-to-pad spacing determined the separation of metal runners. Using an oversized via, the spacing between metal runners can be reduced to the minimum metal-to-metal space that can be patterned.

For large scale integrated circuits, one of the major limiting factors of circuit densities is the spacing between thin film metalization interconnects. This limitation exists for every layer of metal on an integrated circuit; therefore elimination of metal via pads increases circuit densities.

SUMMARY OF THE INVENTION

The present invention is an integrated circuit comprising a substrate. The substrate comprises a semiconductor material and has a first surface. The circuit further comprises a layer of metalization interconnects over the first surface, each interconnect having a width. A first thin film layer comprising a dielectric barrier material is deposited directly onto the first layer of metalization interconnects. A second thin film layer comprising a dielectric passivating material is deposited directly onto the first thin film layer of dielectric barrier material. A via is formed in the two thin film layers over a first metalization interconnect protruding into the via. The first metalization interconnect has a width less than the width of the via. A second metalization interconnect is connected to the first metalization interconnect in the via.

BRIEF DESCRIPTION OF THE DRAWINGS

The FIGS. 1-7 illustrate steps of fabricating an integrated circuit in accordance with the present invention.

DESCRIPTION OF THE PREFERRED EMBODIMENTS

Figure 1:
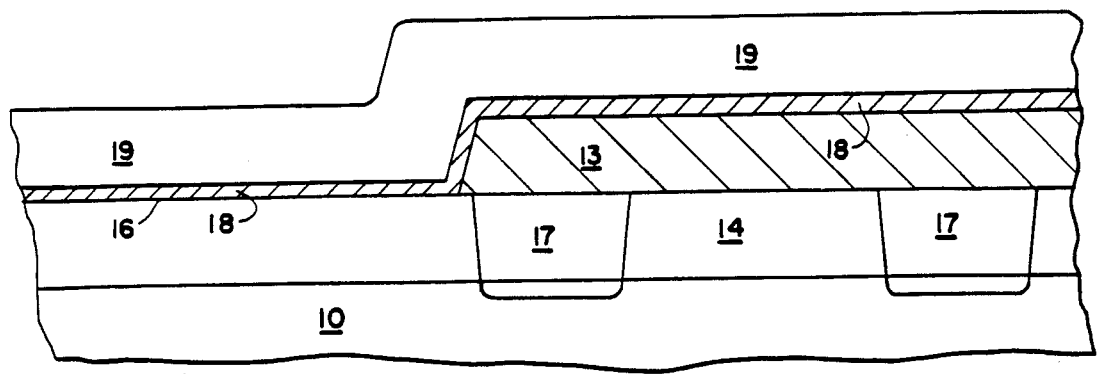

FIG. 1 illustrates a substrate comprising a semiconductor body 10 of, for example, Si and a dielectric layer 14 such as $SiO_2$. The substrate comprises a major surface 16 exposing semiconductor devices 17 formed into the substrate.

A first layer of metalization interconnects 13 is formed on first surface 16 by standard processing techniques such as depositing a first layer of metal 13, photopatterning the metal, and etching the metal to form interconnects 13.

In accordance with the present invention a first thin film layer 18 comprising a dielectric barrier material is then deposited over the first layer of metalization interconnects 13. Dielectric barrier material 18 may comprise $Ti_xO_y$ wherein x and y equal the relative amounts of Ti and O respectively. Such a layer, e.g., of $Ti_xO_y$ may be formed by processes well known in the art, e.g., by RF reactive sputtering of Ti in an $Ar-O_2$ atmosphere (using 90% Argon and 10% oxygen at a pressure of 12 mTorr and an average power density of 4 w/cm$^2$).

For reasons to be explained subsequently, it is preferred that first thin film layer 18 comprising the dielectric barrier material be formed to a thickness of approximately 500 angstroms or less.

Using processing well known in the art, a second thin film layer 19 comprising a dielectric passivating material is then deposited over first thin film layer 18 of dielectric barrier material. Such a layer 19 may comprise $SiO_2$ which may be sputter deposited in situ or formed by chemical vapor deposition in a separate system.

Figure 2:
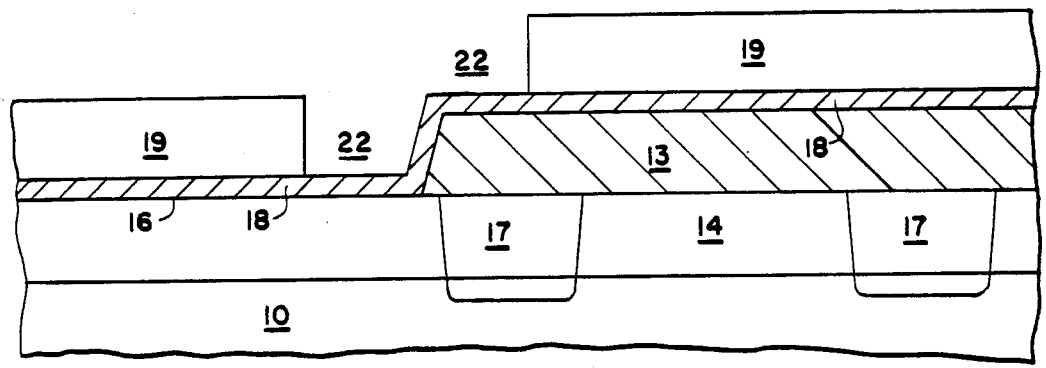

As illustrated in FIG. 2 (and the top views of FIGS. 5 and 7), a via 22 is then plasma etched in second dielectric layer 19 using a first etch gas. This plasma etching step may be accomplished in accordance with processes well known in the art, e.g., in the case of a layer 19 comprising $SiO_2$, in a gas mixture of 50% $CHF_3$:45.9% $CF_4$:4.1% $O_2$. Via 22 may be oversized, having a width 23 greater than the width 24 of a first level metalization interconnect 13.

Figure 5:
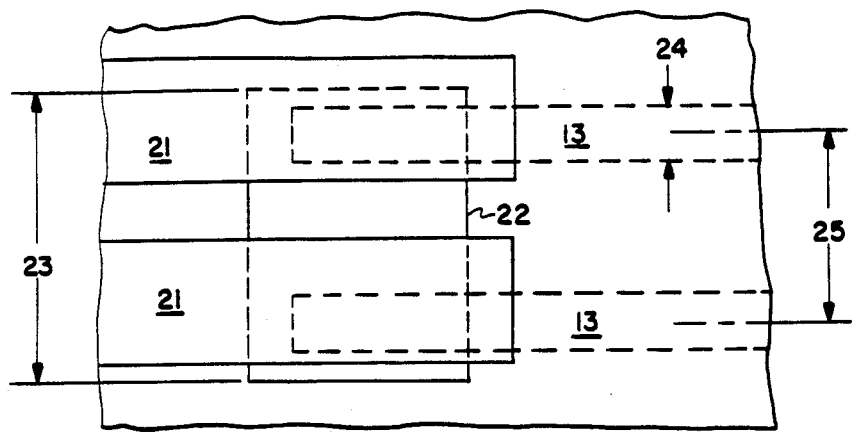
Figure 7:
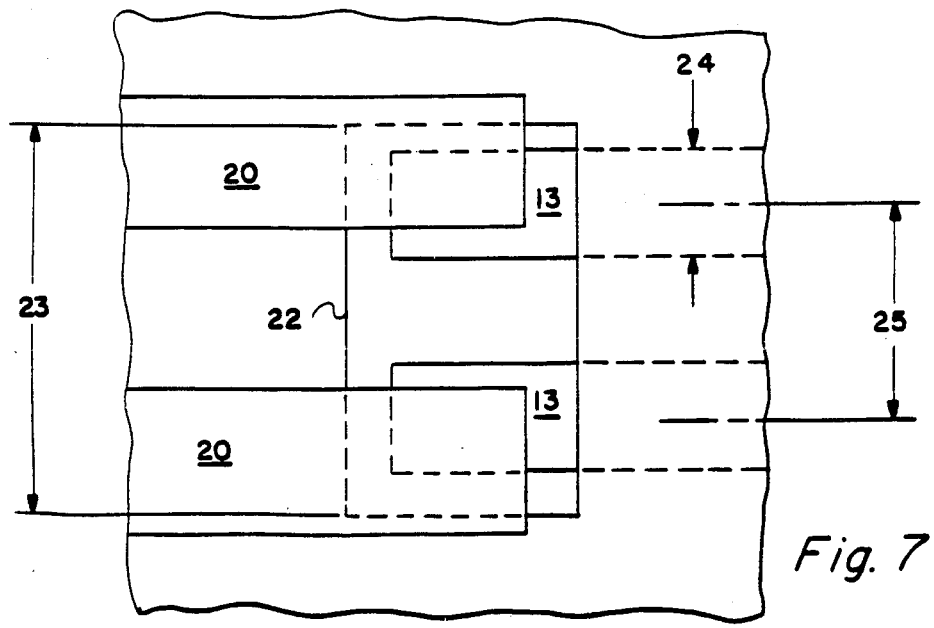

Via 22 may be etched sufficiently large to include more than one metalization interconnect 13 as illustrated in FIGS. 5 and 7. The approach of having one via 22 encompass more than one metalization interconnect 13 can be used to reduce cell spacing 25 between metalization interconnects.

Figure 3:
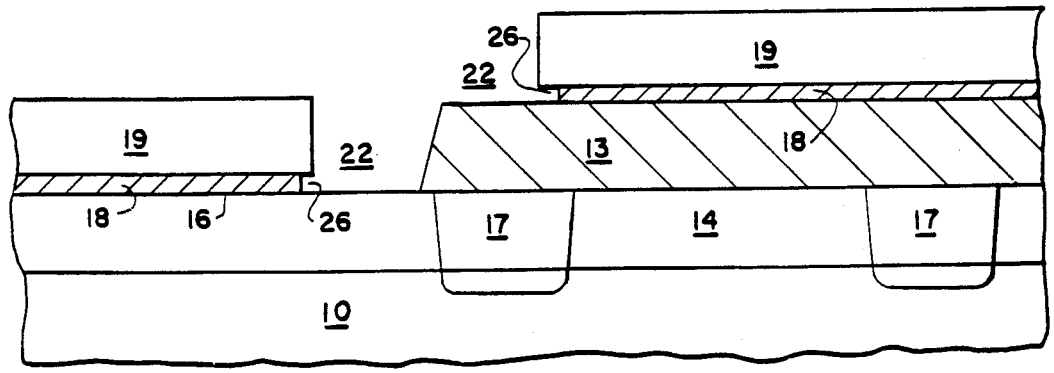

As illustrated in FIG. 3, via 22 is completed by plasma etching dielectric barrier material 18 using a second etch gas to remove material 18 in the area of the via. In the case of dielectric barrier material 18 comprising $Ti_xO_y$, the dielectric may be etched in a $CCl_4$ plasma.

As was previously indicated, it is preferred that first thin film layer 18 comprising the dielectric barrier material be formed to a thickness of approximately 500 angstroms or less. This is preferred since in some cases a dielectric material such as 14 underlying layer 18 can be etched in the same etch gas as that used to remove layer 18 in the region of the via. Making layer 18 thin, e.g., 500 angstroms or less, will permit rapid removal of layer 18 in this region without substantial effect on an underlying dielectric layer such as 14.

Also, in situations where oversized via 22 is over a metalization interconnect such as 13, thin film layer 18 must be removed rapidly before the metalization interconnect is etched. In the case of an aluminum/copper interconnect such as 13, there is an initiation time for mature $Al_2O_3$ (not shown) which forms in the metalization to be removed (sputtered) away in the plasma etch, e.g., in a CCl₄ etch. Therefore, it is preferred to make layer 18 of a thickness of 500 angstroms or less in order to remove layer 18 during this initiation period in order to avoid attack of underlying metalization when removing layer 18 in the via being etched.

Further, making layer 18 thin minimizes undercutting 26 under layer 19 at the edges of via 22. If layer 18 is substantially increased in thickness, undesirable undercutting 26 may increase, thus forming regions which are difficult to metalize with the result of undesirable voids and cusping in the next layer of metalization.

It is also preferred that the dielectric passivating material comprising layer 19 have a high etch rate in the first etch, and that dielectric barrier material 18 not be appreciably effected by the first etch. This is the case, for example, when dielectric barrier material 18 comprises $Ti_xO_y$, dielectric passivating material 19 comprises $SiO_2$, the first etch comprises a gas mixture of 50% $CHF_3$:45.9% $CF_4$:4.1% $O_2$, and the second etch comprises $CCl_4$.

A second layer of metalization interconnects such as 21 (FIGS. 4 and 5) or 20 (FIGS. 6 and 7) may then be formed by standard processing techniques such as depositing a second layer of metal, photopatterning the second layer of metal, and etching the second layer of metal to form interconnects. A metalization interconnect from each of the first and second layers of metalization interconnects are connected in via 22 as illustrated in the Figures.

Figure 6:
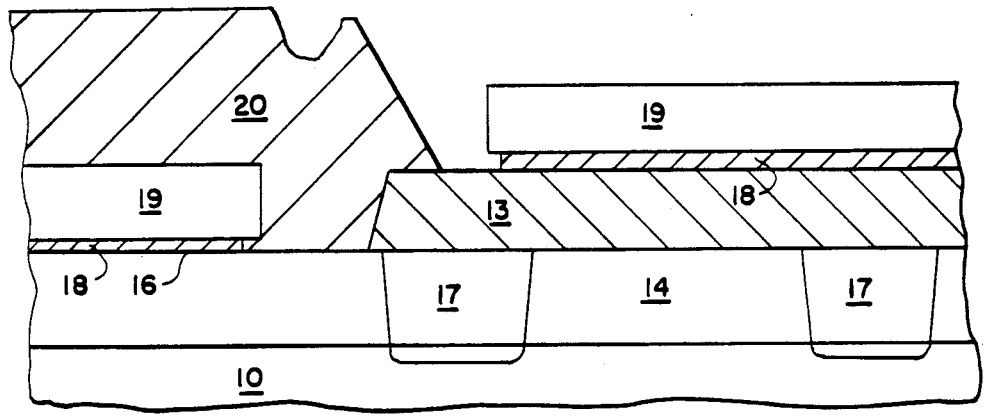

If a metal etch stop is not used between the first and second metalization layers (or if two dissimilar metals are not used in the layers as described below), the configuration of metalization interconnects 21 (illustrated in FIGS. 4 and 5) is preferred over the configuration of metalization interconnects 20 (illustrated in FIGS. 6 and 7).

Figure 4:
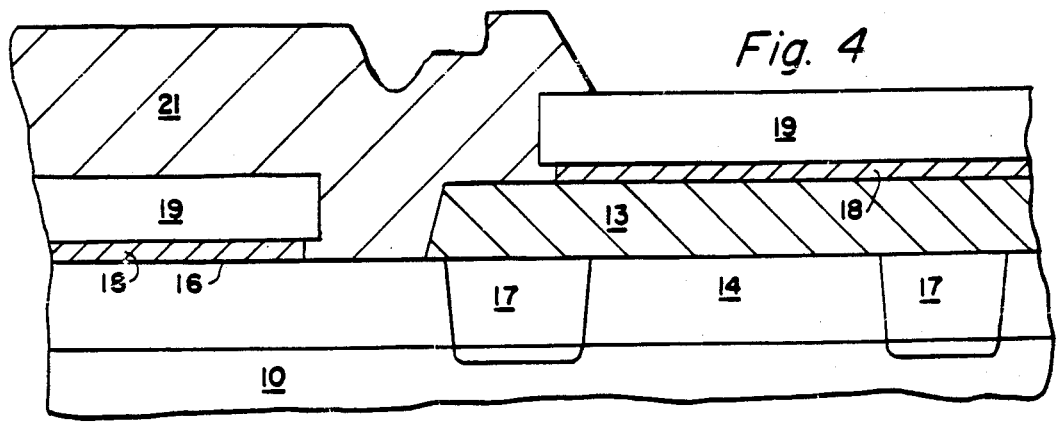

As can be seen in FIGS. 4 and 5, second layer metalization interconnects 21 completely cover first layer metalization interconnects 13 in via 22. Therefore, when etching second layer metalization interconnects 21 (i.e., the configuration illustrated in FIGS. 4 and 5), there will be no attack of first layer metalization interconnects 13 in via 22.

When forming metalization interconnects such as 20 (i.e., the configuration illustrated in FIGS. 6 and 7), an etch stop (not shown) must cover metal layer 13 when etching the second layer of metal; alternately, metal layer 13 may comprise a metal not appreciably etched by the etch gas used to etch the second layer of metal.

An integrated circuit formed in accordance with the present invention comprises a thin film dielectric barrier material such as 18 located under a thin film dielectric passivating material such as 19. The circuit further comprises a via such as 22 formed into the two thin film layers over a metalization interconnect such as 13 which protrudes into the via. The metalization interconnect such as 13 protruding into the via has a width 24 less than the width 23 of the via. A second metalization interconnect such as 20 (FIG. 7) or 21 (FIG. 5) is connected to the first metalization interconnect in the via.

The processing steps described in the present application may be repeated to form additional layers of metalization, e.g., third and fourth layer metalizations. Such additional layers are desirable in modern day high density VLSI devices.

Those skilled in the art will recognize that the present invention is to be limited only in accordance with the scope of the claims, since others skilled in the art may devise other embodiments still within the limits of the claims. For example, the first dielectric barrier material may comprise materials other than the $Ti_xO_y$ material disclosed in the present application.

The embodiments of the invention in which an exclusive property or right is claimed are defined as follows:

1. An integrated circuit, comprising:
    a substrate comprising a semiconductor material and having a first surface;
    a layer of metalization interconnects over the first surface, each interconnect having a width;
    a first thin film layer comprising a dielectric barrier material deposited directly onto the layer of metalization interconnects;
    a second thin film layer comprising a dielectric passivating material deposited directly onto the first thin film layer of dielectric barrier material;
    a first via formed in the two thin film layers over a first of the metalization interconnects; a second via formed in the first of the metalization interconnects, the second via lying at least in part, beneath the first via and having a length which is less than the length of the first via, so that the first of the metalization interconnects is exposed by the first via and a portion of the first surface is exposed by the second via, the unexposed portion of the first of the metalization interconnects remaining covered by the two thin film layers and the first of the metalization interconnects having a width less than the width of the first via; and
    a second layer of metalization interconnects, one of the second layer of metalization interconnects being connected to the first of the metalization interconnects in the vias.

2. The circuit of claim 1 wherein the thin film dielectric barrier material has a thickness of approximately 500 angstroms or less.

3. The circuit of claim 2 wherein the via is formed over a plurality of metalization interconnects which protrude into the via.

4. The circuit of claim 3 wherein the thin film dielectric barrier material comprises $Ti_xO_y$ wherein x and y equal the relative amounts of Ti and O respectively.

5. The circuit of claim 1 wherein the via is formed over a plurality of metalization interconnects which protrude into the via.

6. The circuit of claim 5 wherein the thin film dielectric barrier material comprises $Ti_xO_y$ wherein x and y equal the relative amounts of Ti and O respectively.

7. The circuit of claim 1 wherein the thin film dielectric barrier material comprises $Ti_xO_y$ wherein x and y equal the relative amounts of Ti and O respectively.

8. An integrated circuit, comprising:
    a substrate comprising a semiconductor material and having a first surface;
    a layer of metalization interconnects over the first surface, each interconnect having a width;
    a first thin film layer comprising a dielectric barrier material deposited directly onto the layer of metalization interconnects;
    a second thin film layer comprising a dielectric passivating material deposited directly onto the first thin film layer of dielectric barrier material;
    a via formed in the two thin film layers over a first of the metalization interconnects and extending through part of the first of the metalization interconnects, the via exposing a portion of the substrate first surface and exposing a portion of the first of the metalization interconnects, the unexposed portion of the first of the metalization interconnects remaining covered by the two thin film layers, the first of the metalization interconnects having a width less than the width of the via; and a second layer of metalization interconnects, one of the second layer of metalization interconnects being connected to the first of the metalization interconnects in the via.

9. The circuit of claim 8 wherein the thin film dielectric barrier material has a thickness of approximately 500 angstroms or less.

10. The circuit of claim 8 wherein the via is formed over a plurality of the metalization interconnects, exposing a portion of the substrate first surface and exposing a portion of each of the plurality of metalization interconnects, the unexposed portions of the plurality of metalization interconnects remaining covered by the two thin film layers.

11. The circuit of claim 8 wherein the thin film dielectric barrier material comprises $Ti_xO_y$ wherein x and y equal the relative amounts of Ti and O respectively.

12. An integrated circuit, comprising:
a substrate comprising a semiconductor material and having a first surface;
a plurality of layers of metalization interconnects over the first surface;
a separating layer over the upper of said plurality of layers of metalization interconnects, said separating layer having a substantially planar surface;
an intermediate layer of metalization interconnects over said planar surface, each interconnect of said intermediate layer having a width;
a first thin film layer comprising a dielectric barrier material deposited directly onto said intermediate layer of metalization interconnects;
a second thin film layer comprising a dielectric passivating material deposited directly onto said first thin film layer of dielectric barrier material;
a via formed in said two thin film layers over one of the intermediate layer metalization interconnects, said via exposing a portion of said planar surface and exposing a portion of said one of the intermediate layer metalization interconnects, the unexposed portion of said one of the intermediate layer metalization interconnects remaining covered by said two thin film layers, said one of the intermediate layer metalization interconnects having a width less than the width of the via; and
an upper layer of metalization interconnects, one of said upper layer of metalization interconnects being connected to said one of the intermediate layer metalization interconnects in the via.

13. The circuit of claim 12 wherein the said separating layer comprises a semiconductor material, a metal, or a dielectric.

14. The circuit of claim 12 wherein said first thin film layer has a thickness of approximately 500 angstroms or less.

15. The circuit of claim 12 wherein said via is formed over a plurality of metalization interconnects exposing a portion of said planar surface and exposing portions of said plurality of metalization interconnects, the unexposed portions of said plurality of metalization interconnects remaining covered by said two thin film layers.

16. The circuit of claim 12 wherein said thin film dielectric barrier material comprises $Ti_xO_y$ wherein x and y equal the relative amounts of Ti and O respectively.

* * * * *